United States Patent
Pascucci et al.

(10) Patent No.: US 6,438,669 B2
(45) Date of Patent: *Aug. 20, 2002

(54) TIMESHARING INTERNAL BUS, PARTICULARLY FOR NON-VOLATILE MEMORIES

(75) Inventors: Luigi Pascucci, Sesto San Giovanni; Paolo Rolandi, Voghera; Marco Fontana, Milan; Antonio Barcella, Trescore Balneario, all of (IT)

(73) Assignee: SGS-Thomson Microelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/813,687

(22) Filed: Mar. 7, 1997

(30) Foreign Application Priority Data

Mar. 20, 1996 (EP) .............................................. 96830129

(51) Int. Cl.[7] .............................................. G06F 13/00
(52) U.S. Cl. ...................................... 711/167; 711/103
(58) Field of Search ........................ 711/166, 167–169, 711/170, 171, 103, 157; 710/107–108, 113, 117, 131, 124; 365/94, 189.02

(56) References Cited

U.S. PATENT DOCUMENTS

| 4,890,260 A | * | 12/1989 | Chuang et al. | ................ 365/49 |
|---|---|---|---|---|
| 5,055,661 A | * | 10/1991 | Gochi | .......................... 235/492 |
| 5,367,480 A | | 11/1994 | Matsumiya | ................... 365/63 |
| 5,375,096 A | | 12/1994 | Sugibayashi | ................. 365/230 |
| 5,408,129 A | * | 4/1995 | Farmwald et al. | ........... 257/692 |
| 5,481,677 A | * | 1/1996 | Kai et al. | .................... 395/280 |

FOREIGN PATENT DOCUMENTS

| EP | A-0 296 615 | 12/1988 | ............. G11C/7/00 |

OTHER PUBLICATIONS

European Search Report from European Patent Application 96830129.1, filed Mar. 20, 1996.

* cited by examiner

Primary Examiner—Matthew M. Kim
Assistant Examiner—Denise Tran
(74) Attorney, Agent, or Firm—Wolf, Greenfield & Sacks, P.C.; James H. Morris (57) ABSTRACT

A non-volatile memory device that comprises an internal bus for the transmission of data and other information of the memory to output pads; a timer; and an enabling/disabling circuit for enabling and disabling access to the internal bus; the timer controlling the internal bus to transmit information signals of the memory device that originate from local auxiliary lines over the internal bus when the bus is in an inactive period during a normal memory data reading cycle; the timer controlling the enabling/disabling means to allow/deny access to the internal bus on the part of the information signals or of the data from or to the memory.

44 Claims, 5 Drawing Sheets

TIMESHARING INTERNAL BUS, PARTICULARLY FOR NON-VOLATILE MEMORIES

BACKGROUND OF THE INVENTION

1. Field of the Invention

The present invention relates to a timesharing internal bus, particularly for a non-volatile memory, that transfers streams of data including data originating from the memory; codes related to the wiring of paths; configuration data; information of internal points; etcetera. The present invention more particularly relates to a particular architecture of the memory, which allows better management of the information streams of the memory device.

2. Discussion of the Related Art

In non-volatile memories, such as for example EPROMs, EEPROMs, and FLASH memories, an architecture is generally known which includes a memory matrix with paths directed toward the I/O pads arranged on one side of the device for data reading/writing, while the input (address) pads are placed in a different position, for example on the opposite side, in order to optimize the area of the device.

These input (address) pads stimulate various processes of the memory, whereas the I/O pads collect data in output or provide the data to be written to the memory.

Often it is necessary to transmit outside the memory device, internal situations of the memory (for example for testing or troubleshooting), related to circuit parts that are possibly even quite distant from the I/O terminals.

It is also necessary to reconfigure the read/write paths and to provide particular operating modes.

Due to the considerable distance between the parts, which are typically arranged opposite each other, every form of "dedicated" transmission entails increases in space occupation and management of the memory device.

Accordingly, in order to obtain the desired signals, long connecting lines extending from one side of the memory to the other are necessary. Each connecting line, despite performing functions that are indispensable for the functionality of the circuit, still entails an expenditure of area and may create reliability problems.

Indeed, the larger the memory device, the longer said connecting lines must be, with problems of area occupation, management complexity, and possibility of malfunction.

SUMMARY OF THE INVENTION

The aim of the present invention is therefore to reduce the number of connecting lines coupled between the pads on one side and the other of the memory device, in order to reduce the area of the device.

Within the scope of this aim, an object of the present invention is to optimally utilize the internal transmission resources that intrinsically exist and are indispensable.

Another object of the present invention is to provide a data transmission system that is compact and flexible.

Another object of the present invention is to standardize the functional modes of the memory device and to increase its potential.

Another object of the present invention is to provide an architecture of the memory device that is highly reliable and relatively easy to provide at competitive costs.

This aim, these objects, and others which will become apparent hereinafter are achieved by a non-volatile memory device, characterized in that it comprises an internal bus for the transmission of data and other information of said memory to output pads; timer means; and means for enabling/disabling access to said bus; said timer means timing said internal bus to reroute information signals of the memory device that originate from local auxiliary lines onto said internal bus when said bus is in an inactive period during a normal cycle for reading data of the memory, said timer means driving said enabling/disabling means to allow/deny access to said internal bus on the part of said information signals or of the data from or to the memory.

One embodiment of the present invention is directed to a non-volatile memory device. The non-volatile memory device includes an internal bus for the transmission of data and other information of said memory device to output pads, a timer, means for enabling and for disabling access to the bus. The timer controls the internal bus to reroute information signals of the memory device that originate from local auxiliary lines onto said internal bus when said internal bus is in an inactive period during a normal cycle for reading data of the memory device. The timer controls the enabling and disabling means to allow access to the internal bus by the information signals and to deny access to the internal bus by the data in the first mode of operation, and said timer controlling the enabling and disabling means to allow access to the internal bus by the data and deny access to the internal bus by the information signals in a second mode of operation.

Another embodiment of the present invention is directed to a data transmission method for a non-volatile memory device having a timer, a time sharing internal bus, and an enabling/disabling circuit that controls the access by information signals of the device and of memory data to the internal bus. The method includes steps of detecting an address transition signal at an input to the timer, presetting, by virtue of the timer, signals for correctly reading and capturing the memory data, preventing access of the memory data to the internal bus, during the first step of a reading cycle of the memory during which the memory data is not ready for proper reading, transmitting, on the internal bus, the information signals during the first step of the reading cycle, after transmitting said information signals, during a second step of the reading cycle, preventing access of the information signals to the internal bus, and transmitting, on the internal bus, said memory data during the step of the reading cycle.

Another embodiment of the present invention is directed to a memory having a memory module that stores memory data, an input/output port that receives memory data to be written to the memory and provides memory data read from the memory, an internal bus coupled to the input/output port, at least one auxiliary input line that contains at least one information signal, and a control circuit that controls the memory to operate in one of at least a first mode of operation and a second mode of operation, such that in the first mode of operation the input bus is coupled to the auxiliary input line to receive the information signal, and in the second mode of operation, the input bus is coupled to the memory module to transmit memory data between the input bus and the memory module.

Another embodiment of the present invention is directed to a memory comprising a memory module that stores memory data, an input/output port that receives memory data to be written to the memory and provides memory data read from the memory, an internal bus coupled to the input/output port, at least one auxiliary input line that contains at least one information signal, and means for controlling the memory to operate in one of at least a first mode of operation and a second mode of operation such that in the first mode of operation an input bus is coupled to the auxiliary input line to receive the information signal, and in the second mode of operation, the input bus is coupled to the memory module to transmit memory data between the input bus and the memory module.

Another embodiment of the present invention is directed to a method of transferring data in a memory having an input bus, a storage module, and an auxiliary input line. The method includes steps of coupling the auxiliary input line to the input bus, transferring data from the auxiliary input line to the input bus, coupling the input bus to the memory module, and transferring data between the input bus and the memory module.

DETAILED DESCRIPTION

With reference to the above figures, the architecture of the data bus according to the invention is as follows.

Figure 1:
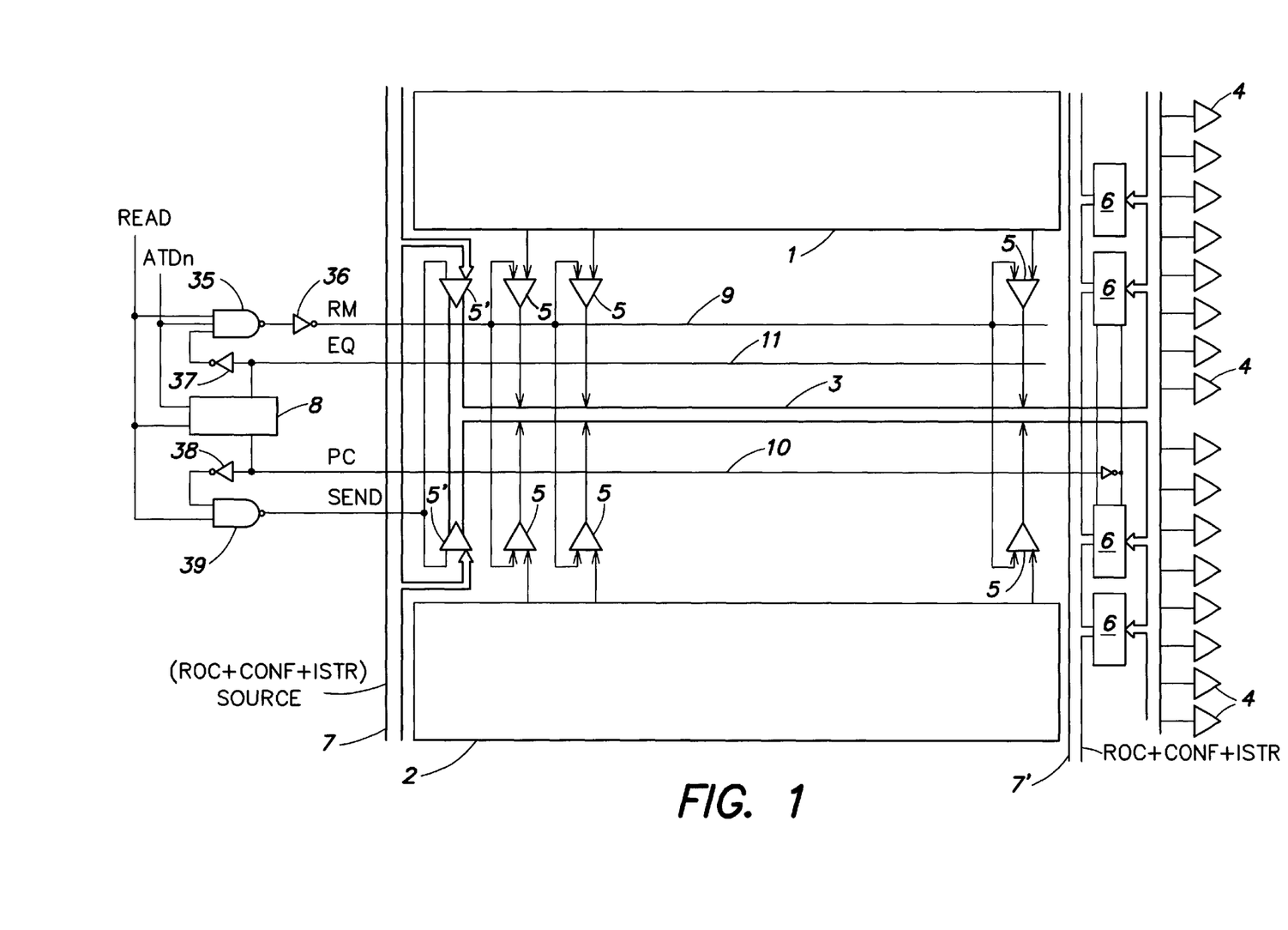
FIG. 1 is a schematic view of the architecture of the memory device according to the invention.

FIG. 1 illustrates the architecture of a memory according to one embodiment of the invention, in which the reference numerals 1 and 2 designate half-matrices that compose the non-volatile memory and 3 is an internal bus for the transmission of data from the memory half-matrices to the output buffers 4 connected to the internal bus 3. Hereinafter, the internal bus will be referenced as data bus to point out its fundamental and irreplaceable function.

The number of output buffers 4 is equal to the number of bits of the memory half-matrices 1 and 2 and in this case is eight for each half-matrix. Reference numeral 5 designate enabling/disabling structures that are advantageously provided by tristate-type circuits and are connected between sense amplifiers that are present in the memory half-matrices (not shown in the figures) and the data bus 3.

The number of said tristate structures 5 is equal to the number of lines present in the data bus 3.

Reference numeral 5' designates similar tristate structures that are however dedicated to enabling/disabling the communication of external sources with the data bus 3.

Data lines originating from different sources carrying system information are designated by the reference numeral 7 in FIG. 1. These data lines are local, i.e., they are arranged at the input (address) pads of the memory matrix or local circuits and do not run along the memory half-matrices 1 and 2. Said data lines are not necessarily buses.

Data storage means, conveniently provided for example by latch-type circuits 6, are connected to the data bus 3 and act as an interface between the data bus 3 and data lines 7', similar to the lines 7, to obtain the information data that originate from the lines 7. These lines are local in this case, too, i.e., they are confined to the output side of the memory matrix.

The memory means 6 can be executed for example also by virtue of flip-flops.

The number of latches 6 shown in FIG. 1 is equal to the number of lines of the data bus 3, but the number of latches can be smaller for the sake of optimizing space occupation.

Timer 8, advantageously constituted by binary structures, is provided for the management of the tristate structures 5, of the charging of the latches 6, and of the enabling of the output buffers 4.

The timer 8 generates signals PC (precharge) and EQ (equalization).

FIG. 1 also shows data lines 9, 10 and 11, dedicated respectively for transmitting signals that are normally present in the memory. The line 9 is dedicated to the signal RM (Read Mode), the line 10 is dedicated to the signal PC (Precharge), and the line 11 is dedicated to the signal EQ (Equalization).

The signal EQ captures the data to be sent over the data bus 3.

The signal RM indicates the beginning of a step for the download of the data arriving from the memory matrix onto the data bus 3; the signal PC, besides precharging the read circuits, samples the data to be stored in the latches 6 involved in the reading operation. The signal RM constitutes an input to the tristate structures 5.

Again with reference to the timer means 8, additional signals are shown which are meant for controlling the read cycle of the memory: a signal ATD (Address Transition Detection, which is normally present in a memory), a signal READ, and a signal SEND.

The signal SEND is a timing signal that is correlated to the burst signal ATD.

The timer 8 receives the signals READ (request to read the memory) and ATDn, and the signals RM and SEND are generated with the signals PC and EQ.

In greater detail, the signal READ and the signal ATDn, together with the signal EQ, inverted by means of the inverter 37, are sent in input to a NAND gate 35 whose output passes through an inverter 36 to produce the signal RM.

The signal READ and the signal PC, inverted by means of the inverter 38, pass through a NAND gate 39 from which the signal SEND is produced.

In particular, while the signals RM, EQ, and PC have their own dedicated lines, for propagation to the output side of the memory, the signal SEND is sent, together with the data present on the data lines 7, to tristate structures 5' (in this case, one for each half-matrix) for propagation over the data bus 3.

Figure 2:
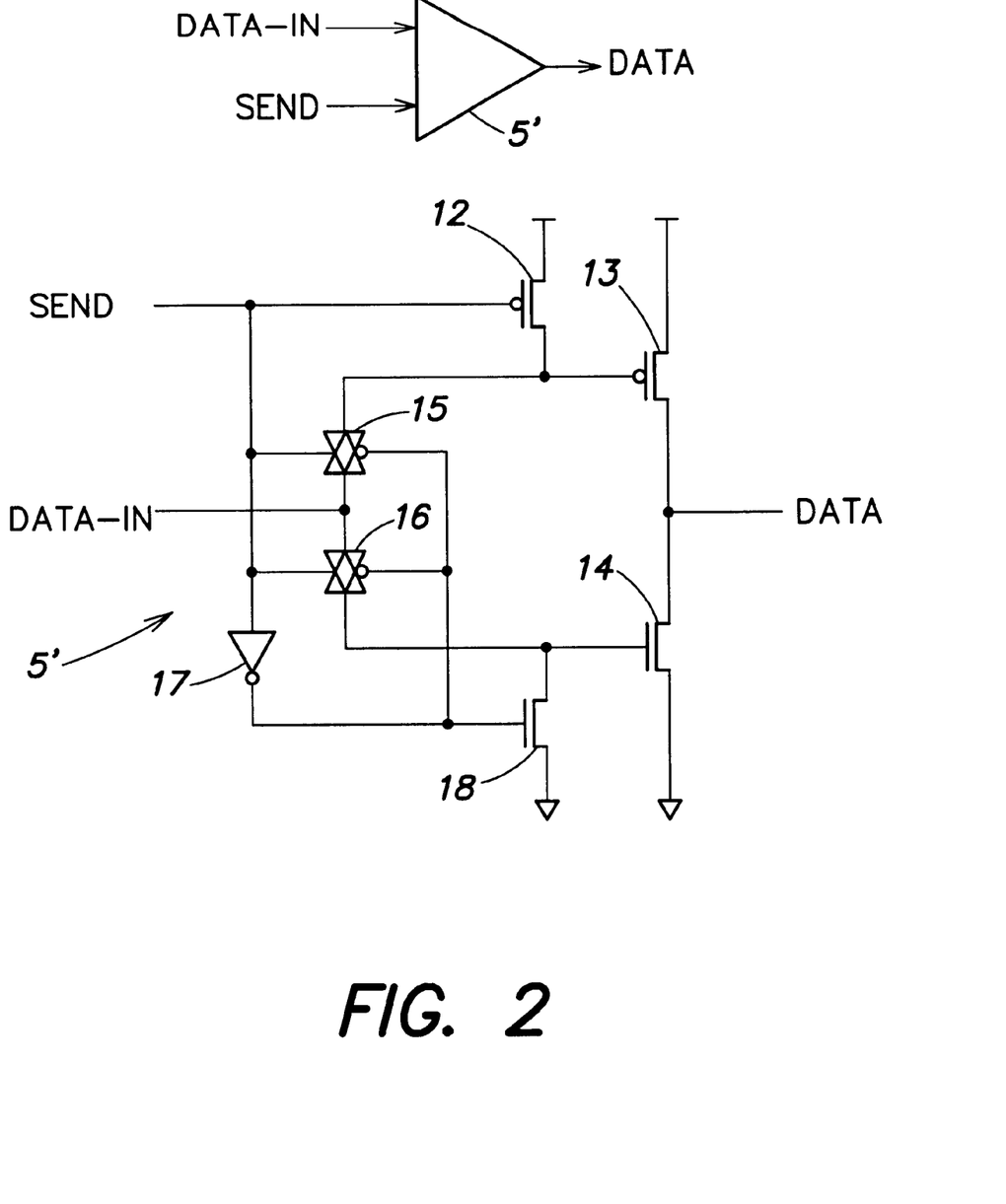
FIG. 2 shows a circuital embodiment of a tristate buffer used in the architecture shown in FIG. 1.

With reference to FIG. 2, one implementation of a tristate structure 5' is shown which receives the data related to system information, referenced here as DATA-IN, and the signal SEND, and produces the data on the data bus 3.

Said conventional structure comprises P-type transistors 12 and 13, two pass transistors 15 and 16 formed respectively by a P-type transistor and by an N-type transistor, N-type transistors 14 and 18, and an inverter 17, which are connected as shown in the figure.

Figure 4A:
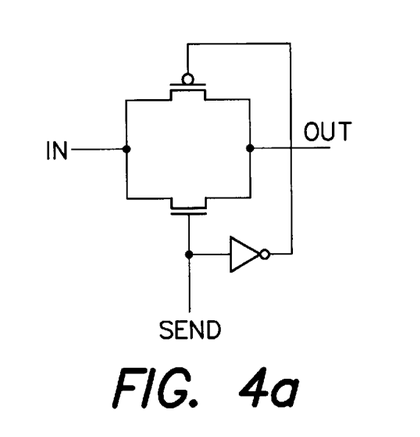
FIG. 4a shows an embodiment of a multiplexer that has the same function as the circuit shown in FIG. 2.
Figure 4B:
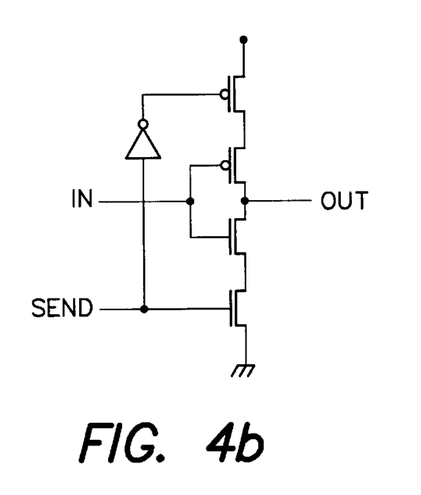
FIG. 4b shows another embodiment of the tristate buffer, equivalent to the one shown in FIG. 2.

FIGS. 4a and 4b illustrate alternate implementations of the tristate circuits 5 and 5'.

Figure 3:
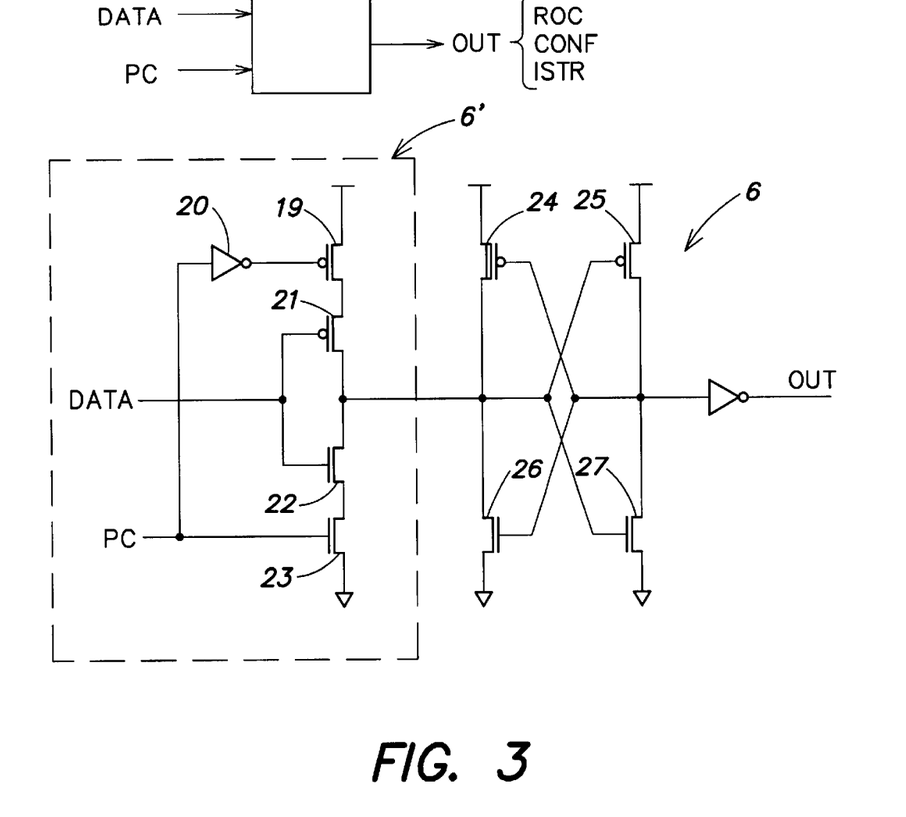
FIG. 3 shows a circuital embodiment of a latch circuit with a tristate buffer used in the architecture shown in FIG. 1.

FIG. 3 illustrates the latch circuit 6 which receives the signal DATA that relates to the system data sent by the data bus 3. A tristate circuit 6' is connected to an input of latch circuit 6. Latch circuit 6' receives the signals DATA, which arrive from the data bus 3, and the precharge signal PC, and provide the signals DATA to the latch circuit 6 when appropriate.

The tristate circuit 6' comprises a P-type transistor 19 having a drain terminal connected to a supply voltage $V_{DD}$ of +5V, having a gate terminal that receives the signal PC, appropriately inverted through the inverter 20, and having a source terminal connected to the drain terminal of a P-type transistor 21 whose source terminal is connected to the drain terminal of an N-type transistor 22.

The gate terminals of transistors 21 and 22 are supplied with the signal DATA.

The source terminal of transistor 22 is connected to the drain terminal of a transistor 23, whose gate terminal is supplied with the signal PC and whose source terminal is connected to ground.

The signal (DATA) provided by the tristate structure 6' described above is sent to the latch circuit 6, which is composed, of two P-type transistors 24 and 25 and of two N-type transistors 26 nd 27. The output signal from the circuit 6 is sent to the lines 7'.

Figure 5:
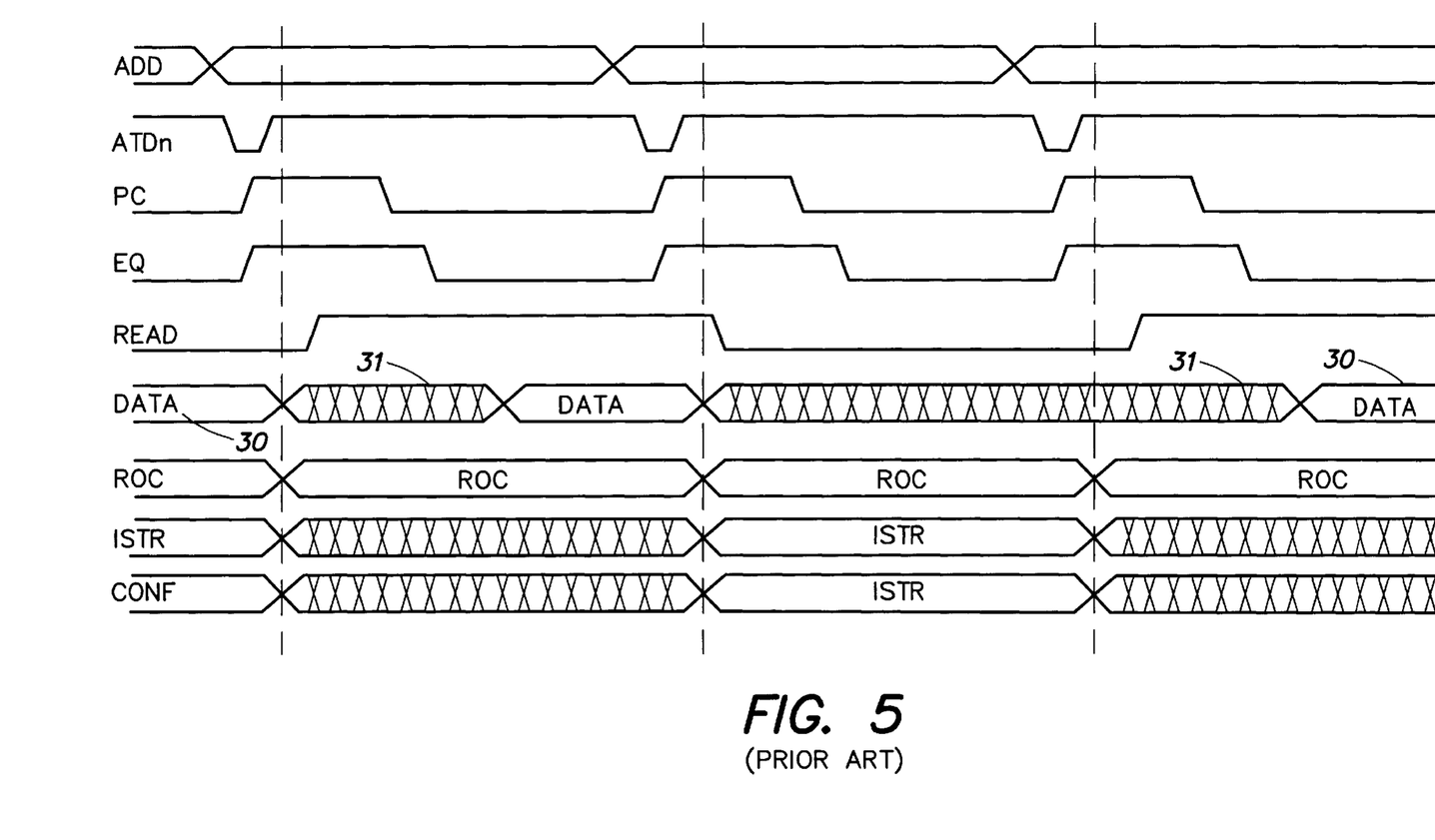
FIG. 5 is a chart of the timings of the signals of a memory device having a conventional architecture.
Figure 6:
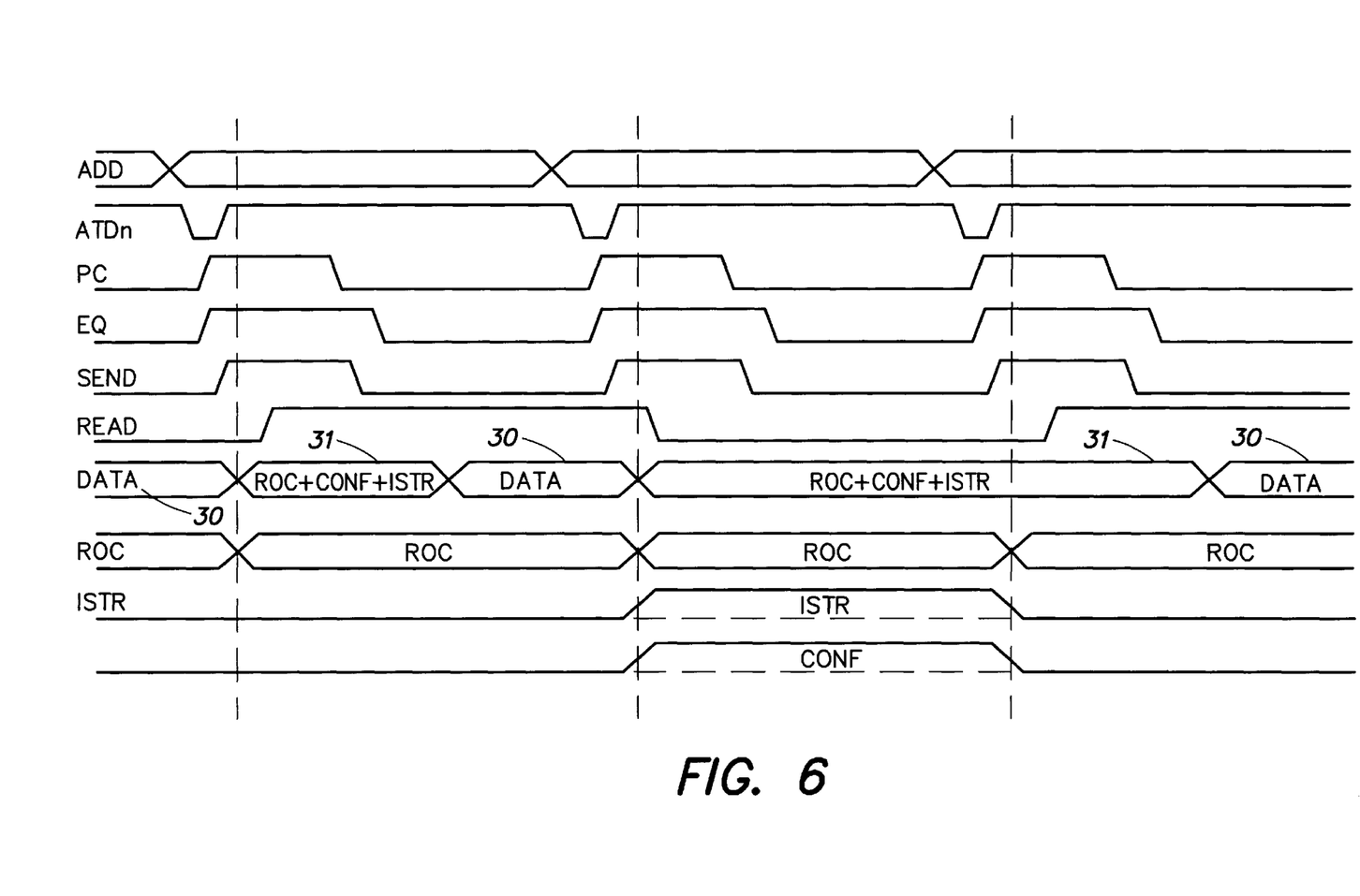
FIG. 6 is a chart of the timings of the signals of a memory device according to the invention.

FIG. 5 is a timing chart of various signals in a normal reading cycle for a non-volatile memory having a conventional architecture, whereas FIG. 6 is a timing chart of the various signals in a reading cycle for a non-volatile memory having the architecture according to the invention, with timesharing management of the data bus 3. These two figures will be explained in detail while describing the operation of the non-volatile memory according to the invention.

With reference to the above figures, the operation of the non-volatile memory device having a timesharing data bus, according to the invention, is as follows.

In order to better understand the operation of the memory device according to the invention, it is necessary to explain a normal reading cycle of a conventional memory device. The figures that provide the best explanation in this regard are FIGS. 5 and 6.

In a normal reading cycle of a memory there are three fundamental intervals:
  a first interval for activating reading by recognition of a transition of the addresses, performed by means of a control pulse ATD (the inverted signal ATD, i.e., ATDn, is shown in FIG. 5);
  a second interval for the propagation and presetting of the nodes affected by the reading operation at their working point, provided by virtue of the setting of two signals that are fundamental for correct reading of the data, namely PC and EQ;
  a third interval for evaluating, capturing, and sending the updated data to the output pads.

Of these three intervals, the only one that requires the data bus 3 for actual data transmission is the third one. The three signals ATD, PC, and EQ are fundamental for the execution of a memory reading cycle.

FIG. 5 is a timing chart of the signals of a conventional memory device, which illustrates the timings of said three signals as a consequence of a change in the address ADD. Therefore, the variation of ADD, indicated by the pulsed signal ATDn, sets the signals PC and EQ.

As shown by the figure, the data bus 3 that transmits the signals DATA is used exclusively during some time slices, designated by the reference numeral 30, whereas in others, designated by 31, it remains unused.

The transmission of signals on data lines that are external to the bus 3 occurs in parallel to the operation of the data bus. These lines transmit signals that provide information as to the state of the system from one end of the memory to the other. The signals that are transmitted are, for example:
  redundancy messages (RED)
  rescrambling codes for the output that is made redundant (ROC, Redundancy Out Code)
  byte identifier
  manufacturer codes (MC, Manufacturer Code)
  special operating modes (verify)
  testing procedures, such as for example DMA (Direct Memory Access). The references ISTR and CONF of FIG. 5 generically relate to instruction and configurations signals, respectively, for the memory device.

Hereinafter, reference will be made to the signals ROC, CONF, and ISTR as to the signals transmitted by the above auxiliary lines, which carry said signals from one side of the memory device to the other.

Said auxiliary lines (i.e., additional to the data bus 3) can be defined as global in the conventional memory device, in contrast with the term "local" used to define the auxiliary lines 7, on one side of the memory device, and 7', on the other side, shown in FIG. 1.

FIG. 6 is a chart of the timings of the signals shown in FIG. 5 in the case of the memory device according to the invention.

In the memory device according to the invention, the data bus 3 is timed appropriately during the normal reading cycle so as to use it, in the periods 31 during which it would normally be inactive, for the transmission of the signals ROC, CONF, and ISTR, thus avoiding the need to have auxiliary lines that connect the input side to the output side of the memory device.

The data bus 3 is used to transmit the signals ROC, CONF, and ISTR by utilizing the timing signals ATD, PC, and EQ that are normally present in the memory device, by virtue of the timer 8.

The signal ATD, at the beginning of the memory read cycle, has the following effects:
  it presets the signals PC and EQ (this step corresponds to the second of the above-mentioned intervals);
  it sets to the tristate mode the structures 5 that connect the memory matrix (in particular the sense amplifiers, not shown) to the data bus 3, deactivating bus control, in order to be able to utilize the data bus during its inactive period, i.e., before the data of the memory matrix can be read reliably and can be transmitted by said bus;
  it keeps in the tristate mode the enabling structures 5' that receive in input the signals CONF, ISTR, and ROC that originate from the lines 7; said structures 5' are close to assuming control of the data bus 3 for transmission of said signals to the corresponding lines 7' arranged at the other side of the memory device.

The time interval 31 is therefore used to transmit the signals ROC, CONF, and ISTR on the data bus 3.

The signal PC, in addition to its normal function of precharging the nodes affected by the reading operation, samples the data present on the data bus 3, determining their charging time in the latches 6. The signal PC also presets to a high impedance the tristate structures 5', freeing the data bus 3 for the transmission of the data that originate from the memory matrices 1 and 2 in the interval referenced by 30.

In detail, the operation of the timer 8 is as follows.

When a burst variation of the signal ATDn occurs, so that said signal goes from high to low, the signal PC switches from low to high and so does the signal EQ. Likewise, with a delay with respect to the switching of said signals, the signal SEND switches from low to high and the signal READ also switches from low to high with an additional delay.

The switching of the signal SEND enables the connection between the local line, which carries the signals ROC+CONF+ISTR, and the data bus 3 for transmission of said signals on the data bus 3 within a first step of the reading cycle of the memory.

The enabling structures of the tristate type 5' thus receive in input the information signals, exemplified in this case, by way of example, by ROC, ISTR, and CONF, and the timing signal SEND, which is related to the signal ATD (in our case, ATDn).

When the signal SEND is low, and therefore when ATDn is high and PC and EQ are low, the transistor 12 is on, the transistor 18 is on, the pass transistors 15 and 16 are off, and the transistors 13 and 14 are off: accordingly, the structure 5' is at high impedance and the connection between the local bus 7 and the internal bus 3 is interrupted.

In FIG. 2, the data that enter the tristate structure are referenced by DATA-IN, since said structure is similar for the tristate structures 5' and for the tristate structures 5, and therefore in the first case DATA-IN references the information signals ROC, ISTR, and CONF, whereas in the second case it references the data that originate from the memory matrix and are designated by DATA in FIGS. 5 and 6. For the tristate structures 5, instead of receiving the signal SEND, signal RM (Read Mode) is received. Signal RM designates the step for downloading the data of the matrix onto the data bus 3.

Therefore, if SEND is low, access to the data bus 3 is denied to the information signals ROC, CONF, and ISTR, and is obviously allowed to the data DATA of the memory matrices 1 and 2, which are transmitted in the interval 30. In this case, therefore, the signal RM is high, so that the data that originate from the memory matrix propagate on the data bus 3 (interval 30 of FIG. 6).

Instead, when the signal SEND switches from low to high, every time ATDn has a burst variation from high to low, the signals PC and EQ go high and the following operation occurs for the tristate structures 5': the transistors 12 and 18 are off, the transistors 15 and 16 are on, and so is one of the two transistors 13 or 14 according to the data item, respectively "1" or "0". Accordingly, the structures 5' enable the transit of the data in input, i.e., the signals ROC, CONF, and ISTR, to the data bus 3, at the time when said data bus would be inactive (interval 31 of FIG. 6).

The similar tristate structures 5 that interface with the memory matrices 1 and 2 at the data bus 3 are in fact at high impedance, since the signal RM in input is low (i.e., the matrix data read mode has not been defined yet).

An inversion of the input signal occurs in the above described tristate structures 5 and 5'; i.e., if a high DATA-IN (which, as described, corresponds to DATA in one case and to ROC+CONF+ISTR in the other) occurs in input, a low DATA is present at the output on the data bus 3, and vice versa.

The inversion is of course not indispensable for the execution of the memory device according to the invention, but is used herein for convenience in implementation. If inversion is not necessary, the tristate structures 5 and 5' may be modified to prevent inversion as understood by those skilled in the art.

The signal PC samples the data present on the data bus 3, determining their charging time in the latches 6. Therefore, if PC is high, the signal DATA which is input to the latch configures said latch; otherwise, if PC is low, the signal DATA is "transparent" for the latch. In the first case, the data are charged in the latches 6 for sending to the lines 7', whereas in the second case they are ignored.

In practice it has been observed that the memory device having a timesharing bus according to the invention fully achieves the intended aim, since it uses the same data bus 3, by virtue of an appropriate timing during the read cycle, for multiple internal functions.

In this manner it is in fact possible to transmit over the same bus both the data that originate from the memory matrix and the information data. The timing is used to utilize the time intervals during which the data bus 3 is inactive to transmit said data, subsequently freeing the bus for the transmission of memory data.

In this manner, the use of long connecting lines from one side of the memory to the other side of the memory for transferring information data is avoided, with consequent advantages in reliability, area occupation, and inspection activity.

The signals used for the timing of the data bus are the signals ATD, PC, and EQ, which are fundamental for a normal reading cycle of a memory and are therefore always present in the device.

The result is a transmission system that is very compact and flexible and optimizes the utilization of the data bus 3.

The device thus conceived is susceptible of numerous modifications and variations, all of which are within the scope of the inventive concept.

Thus, for example, the data lines 7 and 7' can be configured as auxiliary data buses without modifying any detail of the above-described configuration.

The information signals, in addition to being stored in the latches 6, can be sent to the output buffers 4, since the latches 6 are connected to the data bus 3.

The lines that compose the data bus 3 can also be used so as to group the lines in two or more groups, thus assigning multiple meaning levels to the data bus. In other words, by combining as a product the two or more groups, it is possible to use part of the lines of the bus to modify the meaning of a same combination; in this manner, with a decoding approach it is possible to assign to each particular configuration of the second group a different selection or activation, guided by the first group.

The disadvantage of subtracting some lines from the data bus is widely compensated by the possibility of considerably extending the meaning levels that can be assigned to the other lines.

Finally, all the details may furthermore be replaced with other technically equivalent elements.

In practice, the materials employed, so long as they are compatible with the specific use, as well as the dimensions, may be any according to the requirements and the state of the art.

Having thus described at least one illustrative embodiment of the present invention, various alterations, modifications and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A non-volatile memory device having an input side and an output side comprising:
   an internal bus connecting the input side and the output side and being within the memory device for the transmission of data and state information of said memory device to output pads;
   a timer; and
   means for enabling and for disabling access to said internal bus;
   wherein said timer controls said internal bus during a reading cycle having an inactive period and an active period to reroute state information signals of the memory device that originate from local auxiliary lines onto said internal bus during the inactive period, said timer controlling said enabling and disabling means to allow access to said internal bus by said state information signals and deny access to the internal bus by the data during the inactive period, and said timer controlling said enabling and disabling means to allow access to said internal bus by said data and deny access to the internal bus by the state information signals during the active period.

2. The non-volatile memory device according to claim 1, further comprising storage means for storing said state information signals during the inactive period.

3. The non-volatile memory device according to claim 1, wherein said timer has a first input to receive an address transition detection signal of said memory device and a second input to receive a signal for requesting the reading of said memory device.

4. The non-volatile memory device according to claim 1, wherein said enabling and disabling means includes first controlling means for controlling access to said internal bus by said state information signals, and second controlling means for controlling access to said internal bus by the data.

5. The non-volatile memory device according to claim 4, wherein said timer is adapted to generate signals for correctly reading and capturing data of said memory including a timing signal for signaling the first controlling means to allow access to the bus by said state information signals, and a read mode signal for signaling said second controlling means to allow access to the internal bus by the data.

6. The non-volatile memory device according to claim 5, wherein said first controlling means has a first input to receive the state information signals and a second input to receive the timing signal generated by said timer.

7. The non-volatile memory device according to claim 5, wherein said second controlling means has a first input to receive the memory data and a second input to receive the read mode signal generated by said timer.

8. The non-volatile memory device according to claim 2, wherein said storage means is coupled between said internal bus and local output auxiliary lines.

9. The non-volatile memory device according to claim 1, said means for enabling and disabling access to the bus includes a tristate circuit.

10. The non-volatile memory device according to claim 2, further comprising means for enabling and disabling the storage of the state information signals in said storage means.

11. The non-volatile memory device according to claim 2, wherein said storage means includes a latch circuit.

12. The non-volatile memory device according to claim 2, wherein said storage means includes at least one flip-flop circuit.

13. The non-volatile memory device according to claim 2, wherein said internal bus has a number of bus lines, and wherein the storage means includes a number of storage elements, the number of storage elements being equal to the number of bus lines of said internal bus.

14. The non-volatile memory device according to claim 9, wherein said internal bus has a number of bus lines, and wherein the second control means includes a number of control circuits, the number of control circuits being equal to the number of bus lines of said internal bus.

15. The non-volatile memory device according to claim 8, wherein said local auxiliary lines and said local auxiliary output lines are arranged at opposite sides of said memory device, and wherein transmission of state information between said local auxiliary lines and said local auxiliary output lines occurs exclusively through said internal bus.

16. The non-volatile memory device according to claim 1, wherein said local auxiliary lines form a local auxiliary bus.

17. The non-volatile memory device according to claim 1, wherein said internal bus is adapted to transmit said state information signals to said output pads.

18. A data transmission method during a reading cycle for a single non-volatile memory device having an internal array of memory cells and having a timer, a timesharing internal bus that connects an input side of the memory device to an output side of the memory device, and an enabling/disabling circuit that controls the access by state information signals of said device and of memory data to the internal bus, the method comprising steps of:
   detecting an address transition signal at an input to said timer;
   presetting, by virtue of said timer, signals for correctly reading and capturing the memory data;
   preventing access of said memory data to the internal bus, during a first step of the reading cycle of said memory during which the memory data is not ready for proper reading;
   transmitting, on the internal bus, said state information signals during the first step of the reading cycle;
   after transmitting said state information signals, during a second step of the reading cycle, preventing access of said state information signals to the internal bus; and
   transmitting, on the internal bus, said memory data during the second step of the reading cycle.

19. The method according to claim 18, further comprising a step of storing said state information signals transmitted over said internal bus in a storage device.

20. The method according to claim 18, wherein the transmission of state information signals and the transmission of memory data over said internal bus occur in a mutually exclusive manner, at different times, during the reading cycle of the memory device.

21. A memory comprising:
   a memory module that stores memory data;
   an input port and an output port that, respectively, receives memory data to be written to the memory module and provides memory data read from the memory module, the input port and the output port being disposed on opposite sides of the memory;
   an internal bus within the memory module and coupled between the input port and the output port;
   at least one auxiliary input line that contains at least one state information signal; and
   a control circuit, coupled to the internal bus and coupled to the at least one auxiliary line, that controls the memory during a reading cycle having an active period and an inactive period such that during the inactive period an input bus is coupled to the auxiliary input line to receive the state information signal, and during the active period the input bus is coupled to the memory module to transmit memory data between the input bus and the memory module.

22. The memory of claim 21, further comprising a storage unit coupled to the internal bus to receive the at least one state information signal during the first mode of operation.

23. The memory of claim 22, further comprising at least one auxiliary output line coupled to the storage unit to receive the at least one state information signal.

24. The memory of claim 23, wherein the control circuit includes a control module having a first input to receive an address transition signal, a second input to receive a read request signal, a first output to provide a first control signal and a second output to provide a second control signal.

25. The memory of claim 24, wherein the control circuit further includes:
   a first switching circuit having a first input coupled to the control module to receive the first control signal, a second input coupled to the auxiliary input line to receive the at least one state information signal, and an output coupled to the input bus, the first switching circuit, responsive to a first state of the first control signal, coupling the auxiliary input line to the input bus, and the first switching circuit, responsive to a second state of the first control signal, decoupling the auxiliary input line from the input bus; and
   a second switching circuit having a first input coupled to the control module to receive the second control signal, a second input coupled to the memory module, and an output coupled to the input bus, the second switching circuit, responsive to a first state of the second control signal, coupling the memory module to the input bus, and the second switching circuit, responsive to a second state of the second control signal, decoupling the memory module from the input bus.

26. The memory of claim 25, wherein the control module has a third output coupled to the storage unit to provide a third control signal, the storage unit, responsive to a first state of the third control signal, transferring data from the input bus to the auxiliary output line, the storage unit, responsive to a second state of the third control signal, preventing the transfer of data from the input bus to the auxiliary output line.

27. The memory of claim 26, wherein the auxiliary input line and the auxiliary output line are disposed on opposite sides of the memory.

28. The memory of claim 21, wherein the control circuit includes a control module having a first input to receive an address transition signal, a second input to receive a read request signal, a first output to provide a first control signal and a second output to provide a second control signal.

29. The memory of claim 28, wherein the control circuit further includes:
   a first switching circuit having a first input coupled to the control module to receive the first control signal, a second input coupled to the auxiliary input line to receive the state information signal, and an output coupled to the input bus, the first switching circuit, responsive to a first state of the first control signal, coupling the auxiliary input line to the input bus, and the first switching circuit, responsive to a second state of the first control signal, decoupling the auxiliary input line from the input bus; and
   a second switching circuit having a first input coupled to the control module to receive the second control signal, a second input coupled to the memory module, and an output coupled to the input bus, the second switching circuit, responsive to a first state of the second control signal, coupling the memory module to the input bus, and the second switching circuit, responsive to a second state of the second control signal, decoupling the memory module from the input bus.

30. The memory of claim 29, further comprising a storage unit coupled to the internal bus to receive the state information signal during the first mode of operation, and wherein the control module has a third output coupled to the storage unit to provide a third control signal, the storage unit, responsive to a first state of the third control signal, transferring data from the input bus to the auxiliary output line, the storage unit, responsive to a second state of the third control signal, preventing the transfer of data from the input bus to the auxiliary output line.

31. The memory of claim 21, further comprising an auxiliary output tine, coupled to the input bus in the first mode of operation of the memory to receive the state information signal.

32. The memory of claim 31, wherein the auxiliary input line and the auxiliary output line are disposed on opposite sides of the memory.

33. A memory comprising:
   a memory module that stores memory data;
   an input port that receives memory data to be written to the memory module;
   an output port that provides memory data read from the memory module and that is disposed on a side of the memory opposite the input port;
   an internal bus coupled between the input port and the output port;
   at least one auxiliary input line that transmits at least one state information signal; and
   means for controlling the memory during a reading cycle having an active period and an inactive period, such that during the inactive period the internal bus is coupled to the auxiliary input line to receive the state information signal, and during the active period the internal bus is coupled to the memory module to transmit memory data between the internal bus and the memory module.

34. The memory of claim 33, further comprising a storage unit coupled to the internal bus to receive the state information signal during the first mode of operation.

35. The memory of claim 34, further comprising at least one auxiliary output line coupled to the storage unit to receive the state information signal.

36. The memory of claim 35, wherein the control means includes means for controlling the storage unit to transfer the state information signal from the input bus to the auxiliary output bus in the first mode of operation of the memory, and means for controlling the storage unit to prevent transfer of the memory data from the input bus to the auxiliary output line in the second mode of operation of the memory.

37. The memory of claim 35, wherein the auxiliary input line and the auxiliary output line are disposed on opposite sides of the memory.

38. A method of transferring data and state information in a memory during a reading cycle having an inactive period and an active period, the memory having an input bus contained within the memory, a storage module, and an auxiliary input line which transmits at least one state information signal, the method comprising steps of:
   coupling the auxiliary input line to the input bus during the inactive period of the reading cycle;

transferring the at least one state information signal from the auxiliary input line to the input bus during the inactive period of the reading cycle;

coupling the input bus to the memory module during the active period of the reading cycle; and transferring data between the input bus and the memory module during the active period of the reading cycle.

39. The method of claim 37, wherein the step of coupling the input bus to the memory module includes a step of decoupling the input bus from the auxiliary input line.

40. The method of claim 39, wherein the step of coupling the input bus to the auxiliary input line includes a step of decoupling the input bus from the memory module.

41. The method of claim 40, wherein the memory further includes a storage circuit coupled to the input bus, and wherein the method further comprises a step of transferring the at least one state information signal from the auxiliary input line to the storage circuit.

42. The method of claim 41, wherein the memory further includes an auxiliary output line, and wherein the method further comprises a step of transferring the at least one state information signal from the storage circuit to the auxiliary output line.

43. The method of claim 38, wherein the memory further includes a storage circuit coupled to the input bus, and wherein the method further comprises a step of transferring the at least one state information signal from the auxiliary input line to the storage circuit.

44. The method of claim 43, wherein the memory further includes an auxiliary output line, and wherein the method further comprises a step of transferring the at least one state information signal from the storage circuit to the auxiliary output line.

* * * * *